United States Patent
Piao

(10) Patent No.: US 6,555,234 B1
(45) Date of Patent: Apr. 29, 2003

(54) BARRIER FOR AND A METHOD OF REDUCING OUTGASSING FROM A PHOTORESIST MATERIAL

(75) Inventor: Fan Piao, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/775,016

(22) Filed: Feb. 1, 2001

(51) Int. Cl.$^7$ ............................... B32B 9/00; B32B 9/04
(52) U.S. Cl. ....................... 428/446; 428/448; 428/451; 428/698; 428/696; 428/336
(58) Field of Search ................... 428/446, 448, 428/451, 689, 698, 699, 696, 336; 430/311, 312

(56) References Cited

U.S. PATENT DOCUMENTS

| | | | |
|---|---|---|---|
| 4,663,275 A | * | 5/1987 | West et al. ................. 430/271 |
| 5,753,548 A | | 5/1998 | Yu et al. |
| 5,858,623 A | | 1/1999 | Yu et al. ..................... 430/315 |
| 5,895,923 A | | 4/1999 | Blake ..................... 250/492.25 |
| 5,955,244 A | * | 9/1999 | Duval ........................ 430/314 |
| 6,235,456 B1 | * | 5/2001 | Ibox ........................... 430/512 |
| 6,274,295 B1 | * | 8/2001 | Dammel et al. ............ 430/322 |

* cited by examiner

Primary Examiner—Robert R. Koehler
Assistant Examiner—Stephen Stein
(74) Attorney, Agent, or Firm—Foley & Lardner

(57) ABSTRACT

A barrier layer can be provided over a photoresist film to prevent outgassing. The barrier layer can be relatively highly transmissive to radiation at the actinic wavelength. The barrier layer can be removed before the photoresist layer is developed.

20 Claims, 3 Drawing Sheets

BARRIER FOR AND A METHOD OF REDUCING OUTGASSING FROM A PHOTORESIST MATERIAL

FIELD OF THE INVENTION

The present invention relates generally to integrated circuit (IC) fabrication, More particularly, the present invention relates to a method of reducing outgassing from the photoresist layer and a barrier for reducing outgassing from the photoresist layer.

BACKGROUND OF THE INVENTION

Integrated circuit (IC) fabrication techniques often utilize a photoresist material or layer to selectively form various IC structures, regions, and layers. Radiation is provided through or reflected off a mask or reticle to form an image on the photoresist layer on a semiconductor wafer. The photoresist layer is positioned to receive the radiation transmitted through or reflected off the mask or reticle. The image received by the photoresist layer corresponds to the pattern on the mask or reticle. The radiation can be light, such as ultra-violet light, vacuum ultra-violet (VUV) light and deep ultra violet light. The radiation can also be x-ray radiation, e-beam radiation, etc.

Generally, the patterned photoresist material can be utilized to define doping regions, deposition regions, etching regions, or other structures associated with an integrated circuit (IC). A conventional lithographic system is generally utilized to project the image to the photoresist material or layer. For example, conventional lithographic system includes a source of radiation, an optical system, and the reticle or photomask. The source of radiation provides radiation through the optical system and through or off of the mask or reticle. A pellicle can be employed between the mask and the wafer to protect mask.

According to one example of a conventional fabrication technique, light is exposed through a binary mask to a photoresist layer on a layer of material. The light can be provided at a number of different wavelengths including 248 nm, 193 nm, and 157 nm. The photoresist layer may be either a positive or a negative photoresist material.

In the case of a positive photoresist material, the light causes photochemical reaction in the photoresist layer. The photoresist layer is removable with a developer solution at the portions of the photoresist that are exposed to light through a mask. The photoresist layer is developed to clear away those portions. An integrated circuit feature, such as a gate, via, or interconnect, is then etched or doped into the layer of material, and the remaining photoresist is removed. In the case of a negative photoresist material, the light causes the photoresist layer to be removable with a developer solution at portions of the photoresist layer that are not exposed to light through the mask.

Various types of photoresist materials are manufactured by a number of manufacturers. The photoresist material can include multiple photoresist films (i.e. a multi-level resist (MLR)). According to some conventional processes, the photoresist layer is provided over an anti-reflective coating (ARC), such as silicon nitride ($Si_3N_4$) or silicon oxynitride (SiON). The anti-reflective coating is disposed above the material which is to be processed.

The composition of photoresist materials generally includes large molecules or polymers which are susceptible to outgassing during the IC fabrication process. Outgassing refers to the release of gas or vapor from a solid and is particularly problematic in vacuum or low pressure environments associated with IC fabrication (e.g., vacuum ultraviolet light lithography). For example, organic photoresist materials can release carbon-containing gasses.

Outgassing can contaminate various components associated with IC fabrication equipment. In particular, outgassing from the photoresist layer can contaminate expensive lenses associated with lithographic equipment. The contamination adversely affects the image quality associated with the lithographic equipment.

The contamination can require that the lenses be cleaned by a laser or by purging gasses. Accommodating these types of cleaning operations adds to the complexity of the design of the lithographic equipment. Also, the cleaning operations increase the cycle time associated the lithographic equipment, thereby increasing IC fabrication costs.

U.S. Pat. No. 4,851,691 discloses a pretreating method of attenuating outgassing of a patterned photoresist layer. The patterned photoresist layer is formed upon a substrate. Prior to processing the substrate with a high energy ion beam, the patterned photoresist layer is bombarded with ions which are electrically inactive with respect to the substrate. Similarly, U.S. Pat. No. 5,858,623 discloses an ion implantation technique to reduce outgassing complications. Despite these techniques, outgassing remains a considerable problem for IC fabrication processes and IC lithographic equipment.

Thus, there is a need for a process which is less susceptible to photoresist outgassing. Further still, there is a need for a barrier which protects lithographic equipment from outgassing associated with the photoresist layer. Even further still, there is a need for a method of manufacturing an integrated circuit which provides an inexpensive barrier to prevent photoresist outgassing.

SUMMARY OF THE INVENTION

An exemplary embodiment relates to a method of manufacturing the integrated circuit which reduces susceptibility to outgassing from a photoresist. The method includes providing a layer of the photoresist over a material, providing a barrier layer over the layer of the photoresist, and exposing the layer of the photoresist to patterned radiation. The method also includes removing the barrier layer and developing the layer of the photoresist.

Another exemplary embodiment relates to an integrated circuit on a semiconductor substrate. The integrated circuit is fabricated by steps of: providing a layer of photoresist over a layer of material, and providing a barrier layer over the layer of the photoresist. These steps can also include exposing the layer of the photoresist to light through a mask, removing the barrier layer, and developing the layer of the photoresist to remove a portion of the photoresist to form a photoresist feature.

Still another exemplary embodiment relates to an integrated circuit (IC) wafer. The wafer includes a photoresist layer and a barrier layer. The barrier layer is disposed above the photoresist layer. The barrier layer is adjacent the photoresist layer and is translucent at the actinic wavelength of the photoresist layer. The photoresist layer and the barrier layer can be stripped during the fabrication of an IC on the wafer.

BRIEF DESCRIPTION OF THE DRAWINGS

Exemplary embodiments will hereafter be described with reference to the accompanying drawings, wherein like numerals denote like elements, and.

DETAILED DESCRIPTION OF PREFERRED EXEMPLARY EMBODIMENTS

Figure 1:
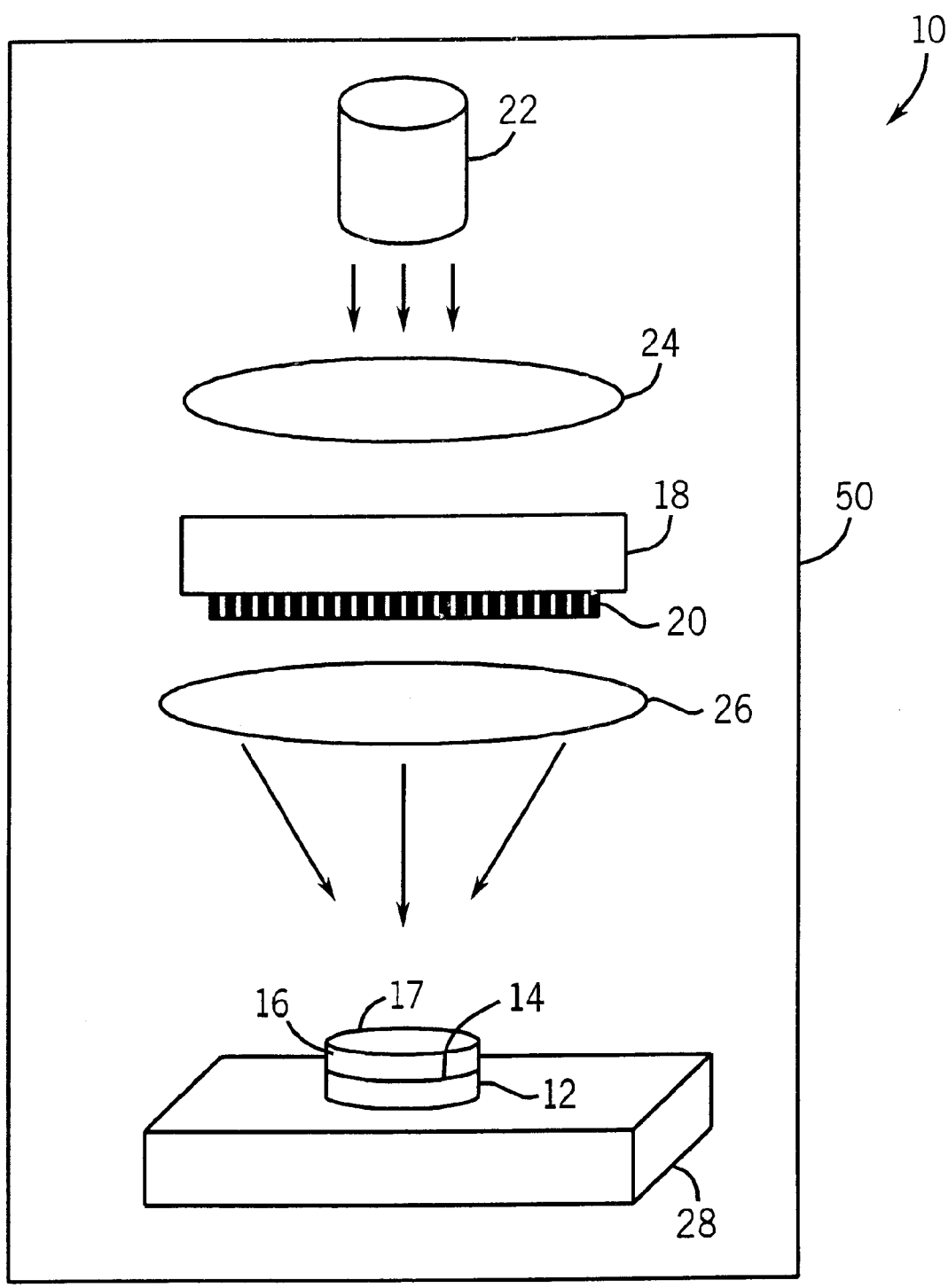
FIG. 1 is a schematic perspective view drawing of a lithographic system for processing a substrate according to an exemplary embodiment.

Referring to FIG. 1, a substrate 12 is shown in a lithographic system 10. Substrate 12 can be a semiconductor substrate, such as, silicon, gallium arsenide, germanium, or other substrate material. Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire IC wafer or part of an IC wafer. Substrate 12 can be part of an integrated circuit, such as, a memory, a processing unit, an input/output device, etc.

Lithographic system 10 provides a pattern of radiation to substrate 12. System 10 can include a chamber 50. Chamber 50 can be a vacuum or low pressure chamber for use in VUV lithography. Chamber 50 can contain any of numerous types atmospheres, such as, nitrogen, etc. Alternatively, lithographic system 10 can be utilized in various other types of lithography including lithography that uses radiation at any number of wavelengths.

Lithographic system 10 includes a light source 22, a condenser lens assembly 24, a reticle or a mask 18, an objective lens assembly 26, and a stage 28. Stage 28 supports substrate 12 and can move substrate 12 with respect to lens assembly 26. System 10 can have a variety of configurations and arrangements. The configuration of system 10 shown in FIG. 1 is exemplary. System 10 can include mirrors, beam splitters, and other components arranged according to other designs. System 10 can be embodied as a lithographic camera or stepper unit. An example of lithographic system 10 is a step and scan machine manufactured by ASML. Other example include Microscan DUV systems by Silicon Valley Group or an XLS family Microlithography System by Integrated Solutions, Inc. of Korea.

Substrate 12 can include a layer of material 14 thereon. Layer of material 14 can be an insulative layer, a conductive layer, a barrier layer, or other layer of material which is to be etched, doped, or layered using the process described herein. In one embodiment, material 14 is a hard mask layer, such as, a silicon nitride layer, a metal layer, or other material. The hard mask layer can serve as a patterned layer for processing of substrate 12 or for processing a layer upon substrate 12. In another embodiment, material 14 is an anti-reflective coating (ARC). Various integrated circuit features may be fabricated using the method described herein.

Substrate 12 and layer of material 14 are not described in a limiting fashion. The principles of the present invention can be applied to any integrated circuit substrate, wafer, mask layer, or other layer. Substrate 12 and the layer of material 14 can be conductive, semiconductive, or insulative. Further, the processing step (etching, doping, layering, etc.) are not discussed in a limiting fashion.

A layer of lithographic material, such as, a photoresist layer or material 16 is deposited over layer of material 14. Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a low-contrast photoresist, but may alternatively be a high-contrast photoresist.

Photoresist material 16 is deposited by, for example, spin-coating over layer of material 14. Material 16 can be provided with a thickness of less than 1.0 microns. Preferably, photoresist material 16 has a thickness between 0.5 and 2.8 microns. Further, photoresist material 16 may be either a positive photoresist or a negative photoresist and can be an organic or non-organic photoresist material.

Material 16 can be provided over an anti-reflective coating (ARC), or can be a multi-level (MLR) material. Photoresist material 16 is preferably covered or coated with a barrier layer 17 in accordance with an exemplary embodiment.

Barrier layer 17 prevents outgassing from photoresist layer 16 within chamber 50. Accordingly, barrier material 17 advantageously protects components of system 10 from contamination. More particularly, condenser lens assembly 26, mask 18 and objective lens assembly 24 are not as susceptible to outgassing from photoresist layer 16 due to barrier layer 17. Thus, system 10 does not require purging apparatus and processes to clean lens assembly 24 and 26 or laser apparatus or processes for cleaning lens assemblies 24 and 26.

Barrier layer 17 is preferably highly transmissive or translucent at the actinic wavelength associated with light provided by light source 22. In one embodiment, light source 22 can provide light at 248 nm wavelength and barrier layer 17 can be an oxide layer. Alternatively, light source 22 can provide light at a 157 nm wavelength and barrier layer 17 can be a fluorine doped silicon dioxide (F doped $SiO_2$) layer.

Barrier layer 17 can be oxide material between 30 nm and 300 nm thick. In one preferred embodiment, layer 17 can be a 100 nm thick silicon dioxide layer. Alternative materials for layer 17 include $Al_2O_3$ or $Si_3N_4$.

The selection of the material for layer 17 can vary depending upon process parameters and design criteria. For example, the material for barrier layer 17 should be chosen so that it is relatively highly transmissive at actinic wavelengths associated with system 10. The term relatively highly transmissive refers to the characteristic of being translucent or transmissive enough to allow photoresist material 16 to be effectively patterned within system 10.

Reticle or mask 18 is a binary mask in this exemplary embodiment. Mask 18 has a translucent substrate preferably fabricated from glass or quartz, and an opaque layer 20, such as chromium or chromium oxide, patterned thereon. Alternatively, mask 18 can be an attenuating phase shift mask, an alternating phase shift mask, or other mask reticle. Opaque layer 20 is patterned to provide a desired circuit pattern to photoresist material 16.

Light source 22 provides light or radiation (e.g., ultraviolet (UV) light) through mask 18 to photoresist layer 16. Light source 22 is an excimer laser in this exemplary embodiment having a wavelength of 248 nanometers (nm), 193 nm, or 157 nm. Alternatively, light source 22 may be any other light source having different wavelengths, including deep UV, VUV, EUV wavelengths.

Figure 2:
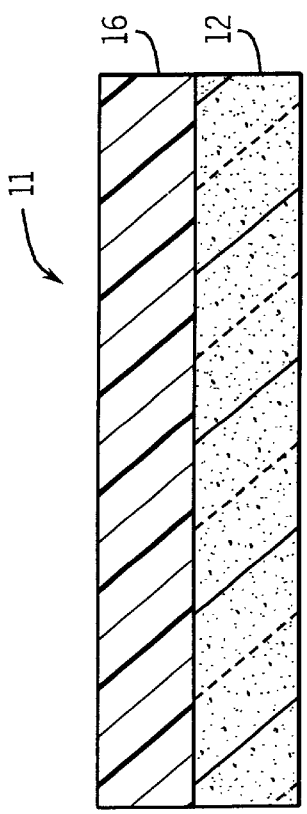
FIG. 2 is a schematic cross-sectional view of the substrate patterned by the lithographic system of FIG. 1, illustrating a photoresist application step according to an exemplary embodiment.

With reference to FIGS. 2–7, an exemplary process of processing at least a portion 11 of substrate 12 is described below as follows. With reference to FIG. 2, substrate 12 includes a photoresist material 16. Photoresist material 16 is preferably a 500 nm thick layer of positive tone photoresist applied to substrate 12. Photoresist material 16 can be applied by spin coating machine, such as, an automated in-line wafer spin coater. For example, substrate 12 can be rotated to a speed of 1800 rpm while photoresist material 16 is applied.

Substrate 12 or the layer upon which photoresist material 16 is applied (e.g., layer 14 of FIG. 1, not shown in FIGS. 2–7) can be cleaned and primed before the application of material 16. In addition, an anti-reflective coating can be provided above substrate 12 or the layer above substrate 12 before material 16 is applied. Preferably, photoresist material 16 is applied when substrate 12 is outside of chamber 50.

Figure 3:
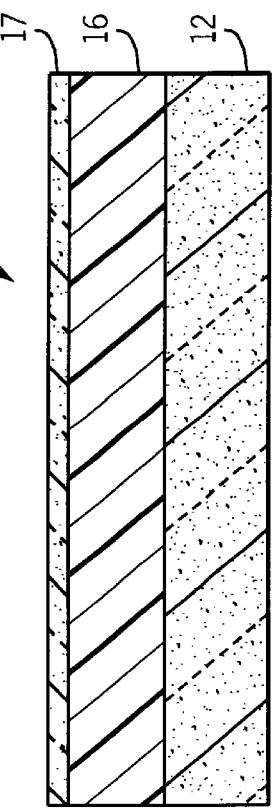
FIG. 3 is a schematic cross-sectional view of the substrate patterned by the lithographic system of FIG. 1, illustrating a barrier layer application step according to an exemplary embodiment.

With reference to FIG. 3, portion 11 includes a barrier layer 17 disposed above photoresist material 16. Preferably, barrier level 17 is applied by CVD (chemical vapor deposition). Barrier layer 17 can be a 50 nm thick layer of silicon dioxide or a 50 nm thick layer of silicon nitride.

Layer 17 is preferably formed outside of chamber 50 in a deposition chamber. Material 16 can be pre-baked in an infrared oven before layer 17 is applied. Alternatively, pre-baking equipment can also be utilized.

Figure 4:
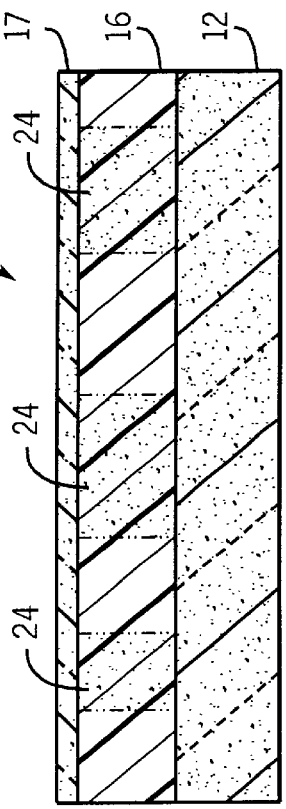
FIG. 4 is a schematic cross-sectional view of the substrate patterned by the lithographic system of FIG. 1, illustrating a radiation exposure step according to an exemplary embodiment.

With reference to FIG. 4, light source 22 provides an exposure of light or radiation through mask 18 to portions 24 of photoresist material 16 in a system, such as, lithographic system 10 (FIG. 1). Substrate 12 includes photoresist material 16 is placed within chamber 50.

In chamber 50, a predetermined amount of light energy, typically measured in mJ/cm$^2$ (millijoules per square centimeter), is provided to photoresist material 16, which is a factor of the intensity of light source 22, the duration of the light provided, the wavelength of the light, and also the composition of photoresist material 16 and any attenuation provided by mask 18 and barrier layer 17. For example, between 10 and 15 mJ/cm$^2$ can be applied in this first exposure step, using a light source having a 248 nm wavelength. In this exemplary embodiment, a positive photoresist is utilized, and sufficient light energy is provided through mask 18 and barrier layer 17 to portions 24 to allow portions 24 of material 16 to be cleared.

Figure 5:
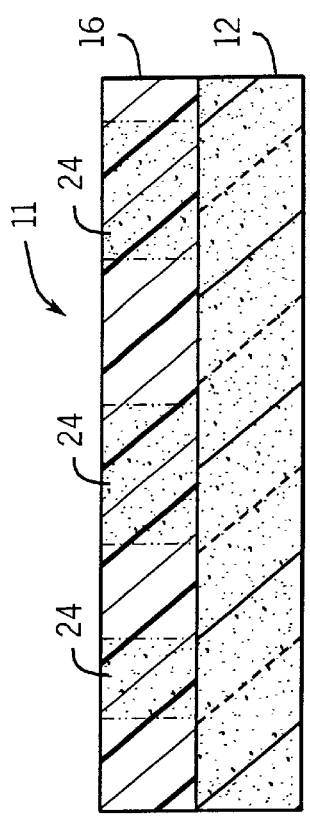
FIG. 5 is schematic cross-sectional view of the substrate patterned by the lithographic system of FIG. 1, illustrating a barrier layer stripping step according to an exemplary embodiment.

With reference to FIG. 5, barrier layer 17 is stripped from photoresist material layer 16. Preferably, barrier layer 17 is stripped in a wet etching process. For example, if barrier layer 17 is thin enough, barrier layer 17 can be removed in a chemical mechanical (CMP) step selective to the material associated with barrier layer 17. The stripping of layer 17 is preferably performed outside of chamber 50 of system 10. Alternatively, dry etching can be utilized to remove barrier layer 17.

Figure 6:
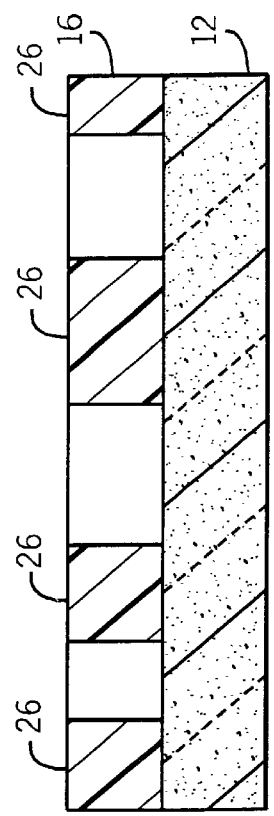
FIG. 6 is a schematic cross-sectional view of the substrate patterned by the lithographic system of FIG. 1, illustrating a developing step according to an exemplary embodiment.

With reference to FIG. 6, a developer solution is provided after barrier layer 17 is stripped to remove portions 24. The developer solution is typically a solvent which renders portions 24 soluble after being exposed to a sufficient amount of light energy. Photoresist features 26 remain on layer of material 14 (FIG. 1) after the developing step.

A variety of developing techniques including spray developing immersion developing and puddle developing can be utilized. The development process preferably is not performed in chamber 50 of system 10. After development, photoresist material 16 can be subjected to inspection.

Figure 7:
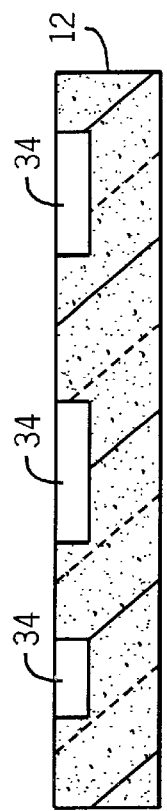
FIG. 7 is a schematic cross-sectional view of the substrate patterned by the lithographic system of FIG. 1, illustrating a substrate processing step in accordance with an exemplary embodiment.

With reference to FIG. 7, after features 26 are formed, substrate 12 can be subject to a processing step to dope, etch or layer substrate 12. In the exemplary embodiment of FIG. 7, a selective etching step into substrate 12 is shown. The selective etching step can be an etching step for shallow trench isolation (STI). However, other processes including doping, layering, and other etching processes can utilize the principles of the present invention. Further, although the example discussed with reference to FIGS. 2–7 provides trenches in substrate 12, other areas associated with layers above substrate 12 can be processed according to the principles of the present invention.

In an alternative embodiment, features 26 are used to pattern a hard mask layer above substrate 12. According to this alternative embodiment, features 26 (the remaining portions of material 16) can be stripped after the hard mask layer is etched. Substrate 12 can be subject to processing after the hard mask layer is etched.

Figure 8:
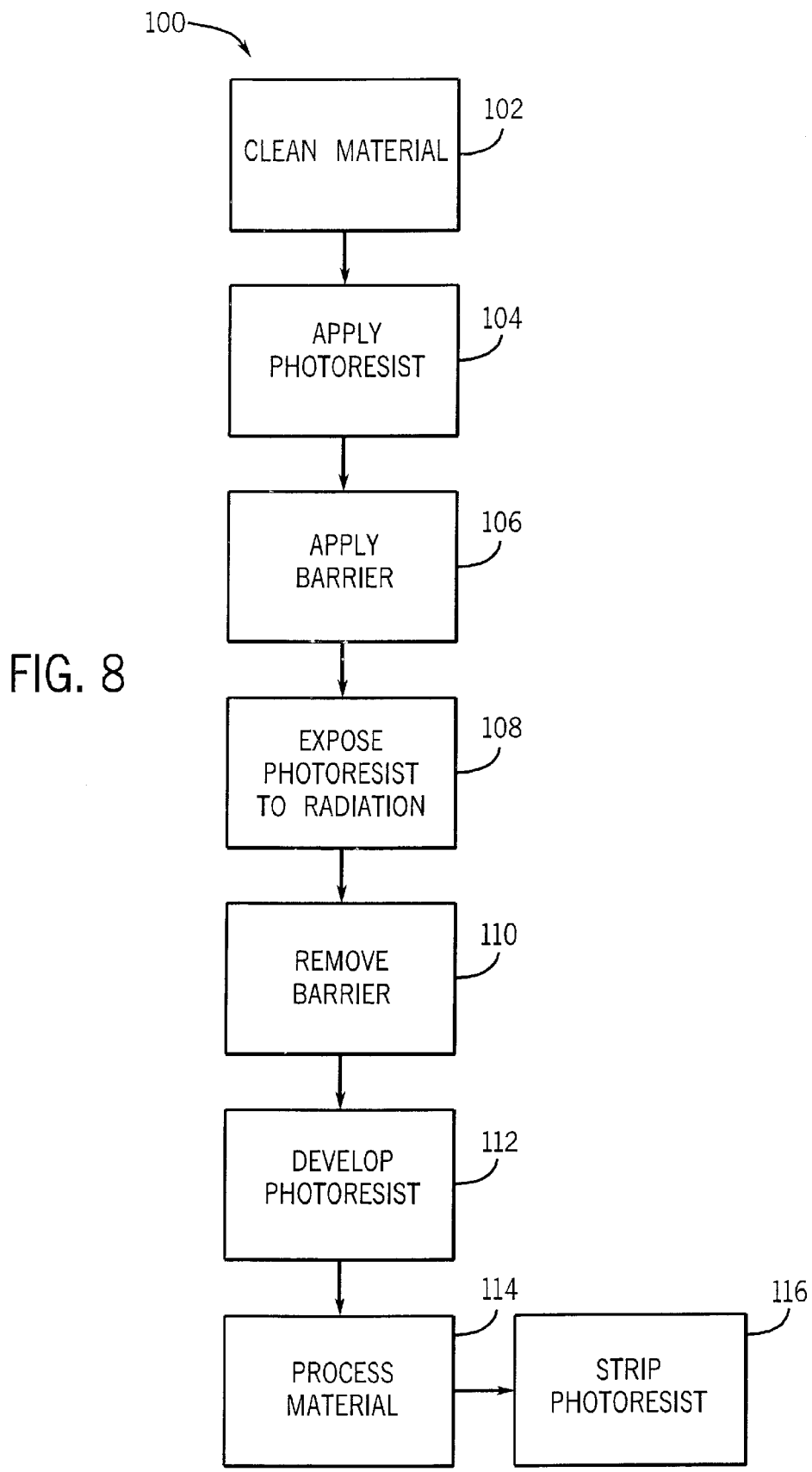
FIG. 8 is a flow diagram showing a process for manufacturing an integrated circuit in accordance with another exemplary embodiment.

With reference to FIG. 8, an exemplary flow diagram 100 is described. At a step 102, substrate 12 or a layer above substrate 12 such as material 14 is cleaned. At a step 104, a photoresist layer such as layer 16 is deposited or applied on substrate 12 (FIG. 2). At a step 106, a barrier layer 17 is deposited or applied on layer 16 (FIG. 3). At a step 108, substrate 12 is placed in chamber 50 (FIG. 1) and exposed to radiation (FIG. 4). The exposure of radiation provides photochemical reactions in portions 24 of layer 16.

At a step 110, barrier layer 17 is removed (FIG. 5). At a step 112, portions 24 are removed from photoresist layer 16 (FIG. 6). At a step 114, substrate 12 is processed in accordance with the developed photoresist material 16 (FIG. 7). At a step 116, photoresist material 16 is stripped.

It is understood that although the detailed drawings, specific examples, and particular values given provide exemplary embodiments of the present invention, the exemplary embodiments are for the propose of illustration only. The method and apparatus in the aforementioned embodiments are not limited to the precise details and descriptions disclosed. For example, although particular films, substrate, layers and processes are described, other materials can be utilized. Various changes may be made to the details disclosed without departing from the spirit of the invention which is defined by the following claims.

What is claimed is:

1. An integrated circuit wafer, the wafer comprising
a photoresist layer, the photoresist layer being exposed to radiation on a first side and being in contact with a substrate or a layer above the substrate on a second side; and
a barrier layer above the photoresist layer, the barrier layer being adjacent the first side of the photoresist layer and being translucent to the radiation, the barrier layer including silicon dioxide or silicon nitride.

2. The wafer of claim 1, wherein the barrier layer includes fluorinated silicon dioxide and the radiation has a wavelength less than 157 nm.

3. The wafer of claim 2, wherein the barrier layer is a material including oxygen.

4. The wafer of claim 3, wherein the barrier layer is a fluorine doped layer of silicon dioxide.

5. The wafer of claim 3, wherein the barrier layer is a material is approximately 100 nm thick.

6. The wafer of claim 5, wherein the photoresist layer includes a resin.

7. The wafer of claim 6, wherein the barrier layer is a fluorine doped 100 nm thick layer of silicon dioxide.

8. An integrated circuit wafer, the wafer being used in the fabrication of integrated circuits, the wafer comprising:

a photoresist layer above a top surface of a substrate, the photoresist layer being exposed to light; and a barrier layer directly above and in contact with the photoresist layer, the barrier layer being highly translucent to light at a wavelength less than 248 nm, the barrier layer including silicon dioxide or silicon nitride.

9. The wafer of claim 8, wherein the barrier layer is a material including silicon dioxide.

10. The wafer of claim 8, wherein the barrier layer is a material including oxygen.

11. The wafer of claim 10, wherein the barrier layer is a fluorine doped layer of silicon dioxide.

12. The wafer of claim 10, wherein the barrier layer is 100 Å or less thick.

13. The wafer of claim 8, further comprising an antireflective coating between the top surface of the substrate and the photoresist layer, the barrier layer is a material including oxygen.

14. The wafer of claim 8, wherein the barrier layer is a fluorine doped 100 Å thick layer of silicon dioxide.

15. An integrated circuit wafer, the wafer comprising:

a photoresist means for reacting with light; and a barrier means above the photoresist means for being adjacent the photoresist means and for preventing outgassing from the photoresist means, the barrier means including silicon dioxide layer or a silicon nitride layer, the barrier means being translucent to the light at a wavelength of less than 248 nm, the photoresist means being closer to a semiconductor substrate than the barrier means.

16. The wafer of claim 11, wherein the barrier means is 100 Å or less thick.

17. The wafer of claim 15, wherein the barrier means is a fluorine doped layer of silicon dioxide.

18. The wafer of claim 15, wherein the barrier means is a silicon nitride layer.

19. The wafer of claim 16, wherein the barrier means is 100 Å thick.

20. The wafer of claim 15, wherein the barrier means is a fluorine doped thick layer of silicon dioxide.

* * * * *